United States Patent
Kurd

(10) Patent No.: US 6,169,424 B1
(45) Date of Patent: *Jan. 2, 2001

(54) SELF-BIASING SENSE AMPLIFIER

(75) Inventor: Nasser A. Kurd, Hillsboro, OR (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/186,057

(22) Filed: Nov. 3, 1998

(51) Int. Cl.[7] .............................. G01R 19/00; G11C 7/00; H03F 3/45
(52) U.S. Cl. .................................. 327/53; 327/66; 327/77
(58) Field of Search .................................. 327/51, 52, 53, 327/56, 65, 66, 74, 77, 78, 81, 88

(56) References Cited

U.S. PATENT DOCUMENTS 4,536,662 * 8/1985 Fujji ..................................... 327/108
4,769,564   11/1987 Gardo .................................. 307/530
5,162,681 * 11/1992 Lee ....................................... 327/53
5,864,254 *  1/1999 Tashiro ................................. 327/319

FOREIGN PATENT DOCUMENTS

0259879A2  10/1987 (EP).

* cited by examiner

*Primary Examiner*—Toan Tran
*Assistant Examiner*—Quan Tra
(74) *Attorney, Agent, or Firm*—Seth Z. Kalson

(57) ABSTRACT

A sense amplifier comprising first and second CMOS inverters, an pMOS current mirror, a nMOS current mirror, a source pMOSFET to source current, and a sink nMOSFET to sink current. The gate voltage of the first CMOS inverter is the input voltage and the gate voltage of the second CMOS inverter is at the reference voltage. The output voltage is at the drains of the first CMOS inverter. The pMOS and nMOS current mirrors provide active loads to the first and second CMOS inverters. The sense amplifier is self-biasing by connecting the gate of the source pMOSFET to the gates of the pMOS current mirror and by connecting the gate of the sink nMOSFET to the gates of the nMOS current mirror.

15 Claims, 9 Drawing Sheets

US 6,169,424 B1

SELF-BIASING SENSE AMPLIFIER

FIELD

Embodiments of the present invention relate to circuits, and more particularly, to sense amplifiers.

BACKGROUND

Fast and robust data communication among components of a computer system, or between and among execution units in one or more processors, is increasingly important as clock speeds increase and as processor core voltages decrease.

FIG. 1 is a high-level diagram where driver 102 transmits data to receiver (or differential comparator) 104 via transmission line 106. Receiver 104 may comprise a sense amplifier, followed by an inverter or buffer to provide a logic output voltage. Transmission line 106 may be the physical layer of a bus. The terms bus and transmission line will often be used interchangeably. Bus 106 may be, for example, a GTL (Gunning Transceiver Logic) bus or a CTC (Center Terminated CMOS) bus. The output voltage at terminal 108 of receiver 104 will usually be a logic voltage representing one of the two Boolean elements "1" and "0". Implicitly indicated in FIG. 1 is a reference voltage source for providing a reference voltage $V_{ref}$, where usually $V_{ref} < V_{cc}$. The voltage at input terminal 110 of receiver 104 is denoted as $V_{in}$. The output voltage of receiver 104 is indicative of $V_{in} - V_{ref}$, where the output is one of the two Boolean elements when $V_{in} > V_{ref}$ and is the other of the two Boolean elements when $V_{in} < V_{ref}$.

It is often desirable that the sense amplifier characteristics should not change appreciably for common mode voltage changes in $V_{in}$ and $V_{ref}$. For example, it may be desirable for the output voltage delay of the sense amplifier to be insensitive to common mode voltage changes. This feature may be even more desirable when there are a plurality of sense amplifiers connected to a bus, because then it is easier to satisfy timing requirements. Also, sense amplifiers with reduced sensitivity to common mode voltage changes are less sensitive to variations in signal integrity induced by noise in the bus, and larger timing margins may be tolerated.

FIG. 2 is a schematic for prior art sense amplifier 200, also called a pMOS (p-Metal Oxide Semiconductor) amplifier because the voltages $V_{ref}$ and $V_{in}$ are the gate voltages of pMOSFETs (p-Metal Oxide Semiconductor Field Effect Transistor) 202 and 204, respectively. Transistors 206 and 208 comprise a matched current pair. Transistor 210 sources current. In FIG. 2, the gate of pMOSFET 210 is connected to the gates of transistors 206 and 208 so that pMOS amplifier 200 is self-biasing. The gate of pMOSFET 210 may be connected to an external bias circuit, not shown, but the connection as shown in FIG. 2 is preferable because it eliminates the need for external biasing and provides feedback to compensate for process, temperature, and voltage variations. The output at node 216 may be connected to a CMOS (Complementary Metal Oxide Semiconductor) inverter (not shown) to provide a CMOS level output voltage.

Operation of pMOS amplifier 200 may heuristically be described as follows. Because the drain-source current of transistors 204 and 208 are essentially equal (ignoring loading at node 216), the output voltage at node 216, which is the drain voltage of nMOSFET 208, will adjust so that nMOSFET 208 pulls the same current as pMOSFET 204. However, pMOSFET 208 is biased by nMOSFET 214 to provide a nearly constant current sink when both are in saturation. That is, pMOSFET 208 provides a very high dynamic impedance, or active load, to pMOSFET 204. If $V_{in} > V_{ref}$, then pMOSFET 204 will pull less current. For nMOSFET 208 to pull less current, its drain voltage (the output voltage at node 216) will decrease so that nMOSFET 208 sinks less current. If $V_{in} < V_{ref}$, then the source-drain current of pMOSFET 204 increases and the drain voltage of nMOSFET 208 will increase so that nMOSFET 208 sinks more current.

FIG. 3 is a schematic for prior art sense amplifier 300, also called a nMOS amplifier because the voltages $V_{in}$ and $V_{ref}$ are the gate voltages of nMOSFETs 302 and 304, respectively. Transistors 306 and 308 comprise a current mirror. Transistor 310 sinks current, and its gate is connected to the gate of pMOSFET 306 so that nMOS amplifier 300 is self-biasing, again eliminating the need for external biasing and providing feedback to compensate for process, temperature, and voltage variations.

The operation of sense amplifier 300 is similar to sense amplifier 200 and may be heuristically described as follows. Transistors 306 and 308 are configured as, a current mirror pair so that pMOSFET 308 provides an active load to nMOSFET 302. Ignoring loading on output node 312, transistors 308 and 302 have the same source-drain current. If $V_{in} > V_{ref}$, the source-drain current of nMOSFET 302 increases and the drain voltage of pMOSFET 308 (which is the output voltage at node 312) decreases so that pMOSFET 308 can provide more current. If $V_{in} < V_{ref}$, the source-drain current of nMOSFET 302 decreases and the drain voltage of pMOSFET 308 increases so that pMOSFET 308 sources more current.

FIG. 4 is a schematic for prior art sense amplifier 400, also called a CMOS amplifier because the voltages $V_{in}$ and $V_{ref}$ are the gate voltages of CMOS inverters 402 and 404, respectively. Transistors 406 and 408 respectively source and sink current, and their gates are connected to each other and to node 410 of CMOS inverter 404 so that CMOS amplifier 400 is self-biasing. When $V_{in}$ transitions above $V_{ref}$, the gate-source voltage of nMOSFET 416 increases, and its source-drain current increases. Because transistors 402 and 416 have the same source-drain current (ignoring loading on the output node 412), the drain voltage of pMOSFET 402, which is the output voltage at node 412, will decrease so that pMOSFET 402 can source more current. By similar reasons, the output voltage will increase when $V_{in}$ transitions below $V_{ref}$.

For some bus topologies, the logic voltages may not be symmetrical about $V_{cc}/2$. For example, for a Gunning Transceiver Logic bus, $V_{ref} = (2/3)V_{cc}$. Thus, the reference voltage $V_{ref}$ may vary due to different bus topologies. Furthermore, as data rates increase there may be more noise on the input voltages. Thus, as discussed earlier, it may be desirable for sense amplifiers to have a relatively wide common mode input voltage range.

As will be discussed later when presenting simulation results, the pMOS sense amplifier of FIG. 2 may have an output delay for a rising output that is approximately 1000 ps (pico-seconds) for a common mode voltage range of 0.1 volts, whereas the output delay for a falling output at the same common mode voltage may be less than 200 ps. This variation in output delays for rising and falling outputs may cause timing problems. Furthermore, the pMOS sense amplifier may not even work for common mode voltages above 0.1 volts.

For the case of the nMOS sense amplifier of FIG. 3, simulations have shown that the output delay for a falling output may be approximately 450 ps and the output delay for a rising output may be less than 150 ps at a common mode voltage of −0.4 volts.

For the CMOS sense amplifier, its gain is highest at $V_{ref} \approx V_{cc}/2$. Variations in $V_{ref}$ or input voltage swings may cause unwanted variations in timing, and the CMOS sense amplifier's common mode input range is relatively limited. Simulations have shown that the CMOS sense amplifier may have an output delay for a falling output of approximately 600 ps and an output delay for a rising output of less than 150 ps at a common mode voltage of 0.2 volts.

Consequently, there is a need for high-speed sense amplifiers that provide relatively smaller variations in output delays for wider common mode voltage ranges than in previous prior art sense amplifiers.

DETAILED DESCRIPTION OF EMBODIMENTS

Figure 1:
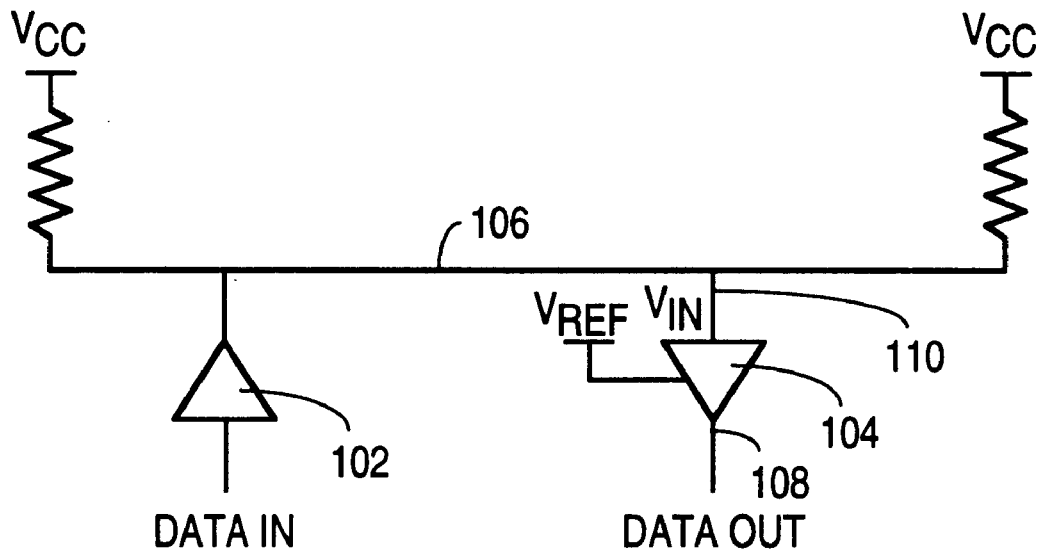
FIG. 1 is a system level diagram illustrating a receiver in communication with a transmitter or bus driver.
Figure 2:
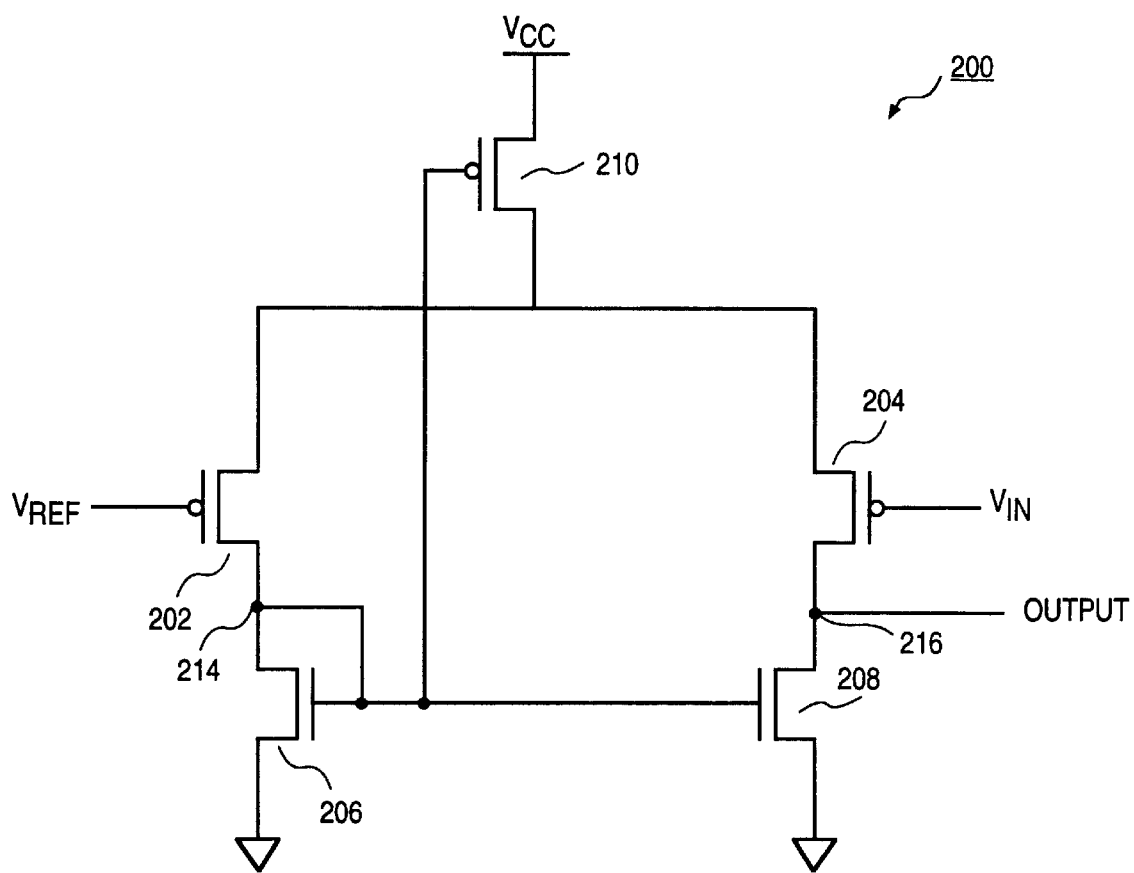
FIG. 2 is a prior art pMOS sense amplifier.
Figure 3:
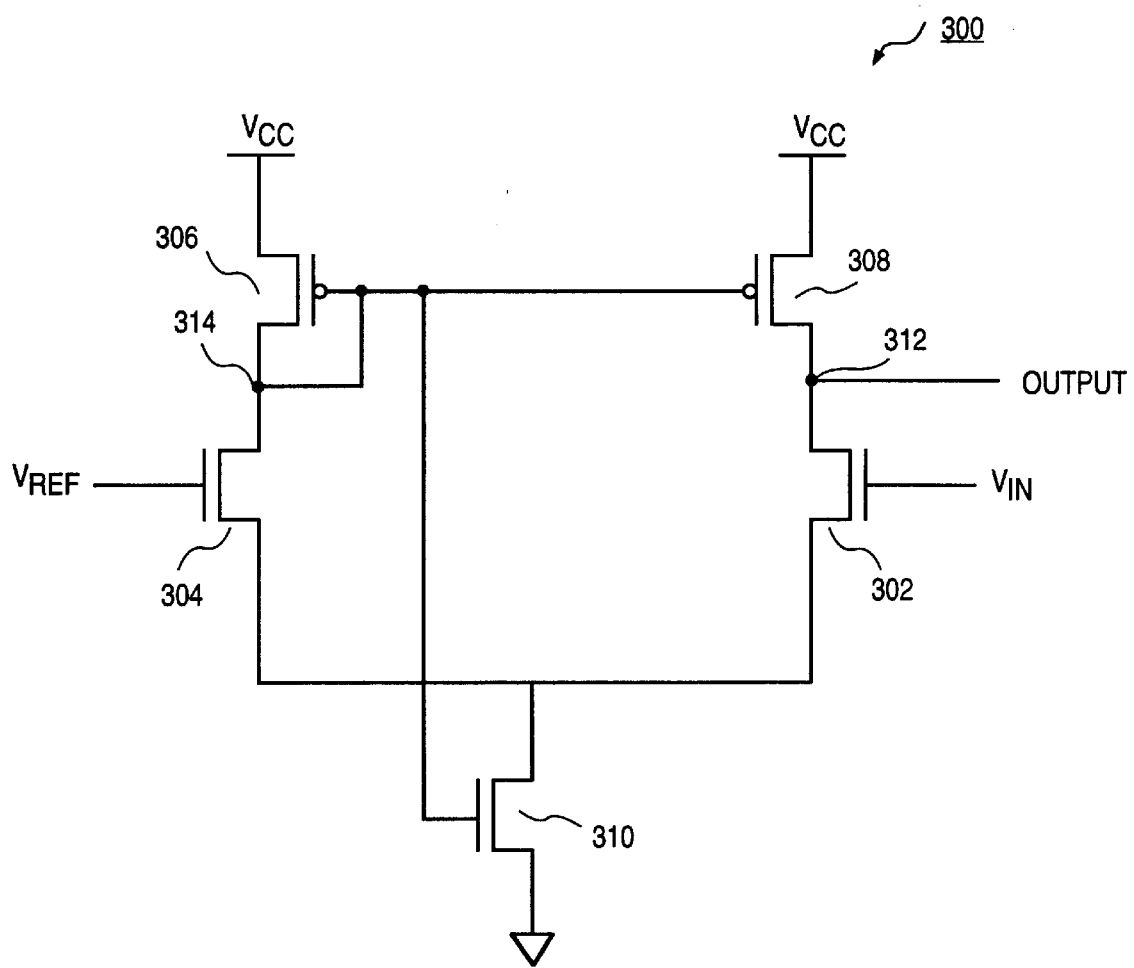
FIG. 3 is a prior art nMOS sense amplifier.
Figure 4:
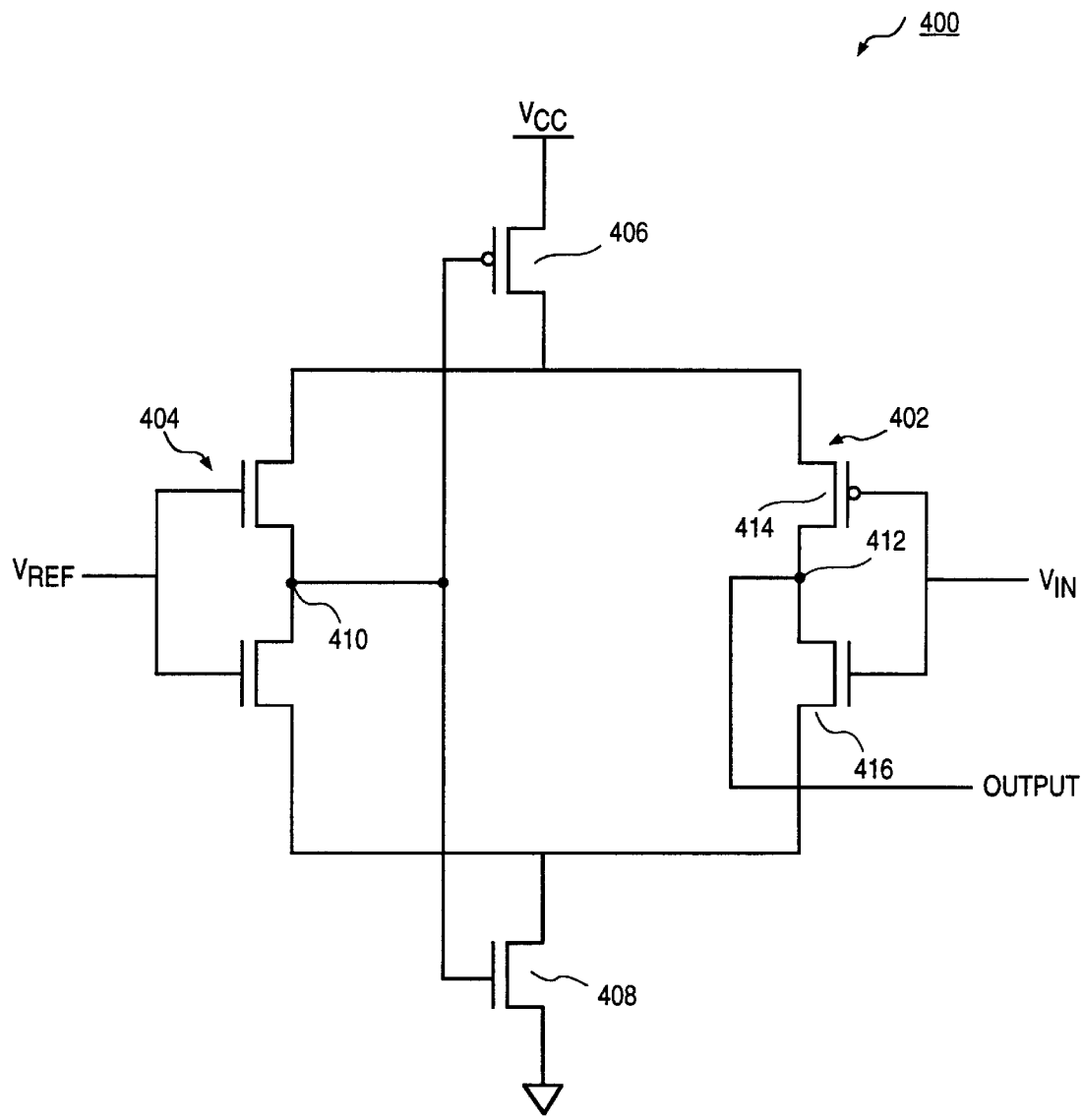
FIG. 4 is a prior art CMOS sense amplifier.
Figure 5:
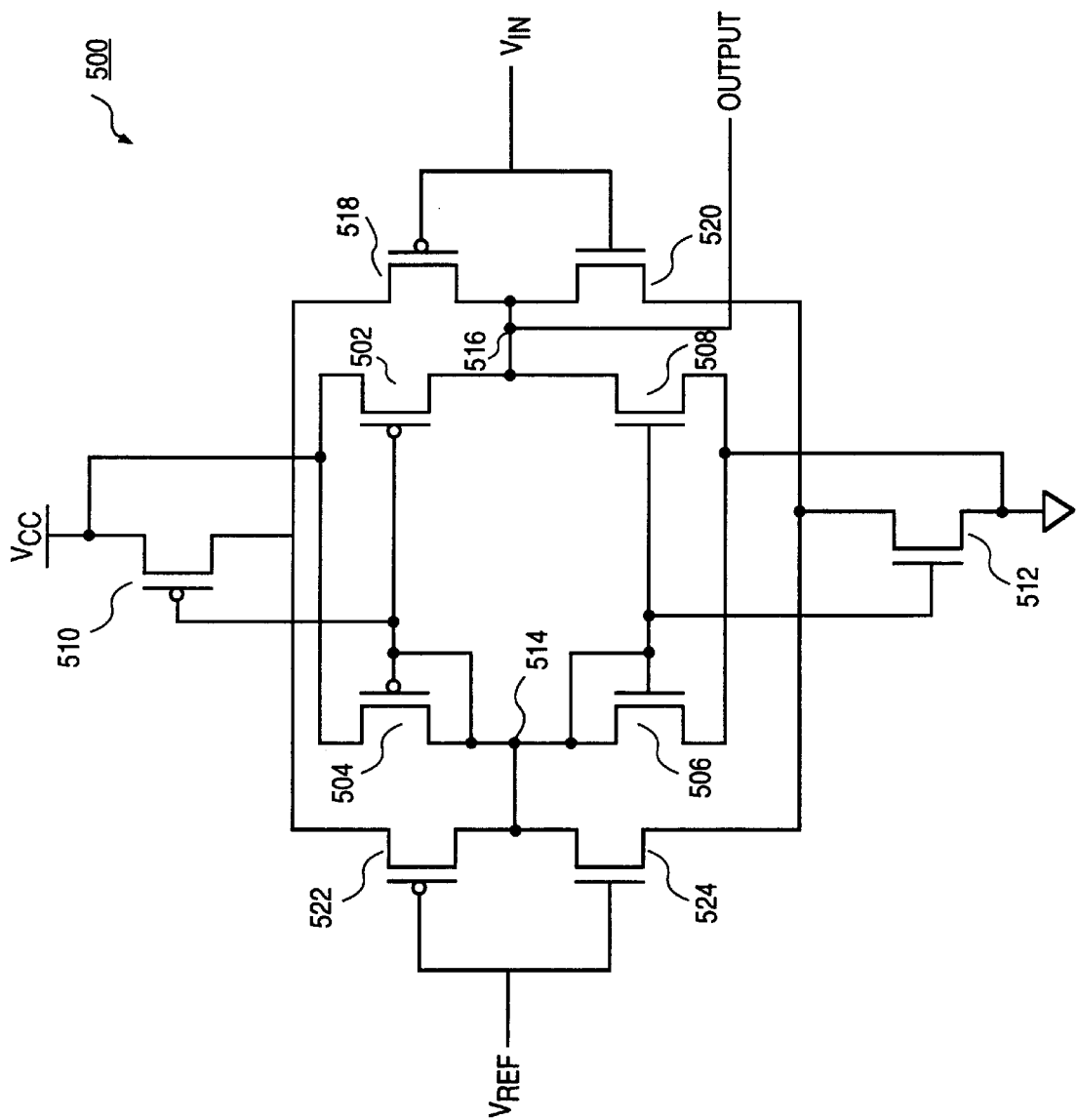
FIG. 5 is an exemplary embodiment of the present invention sense amplifier.

FIG. 5 is a schematic for an exemplary embodiment of the present invention sense amplifier. Transistors 502 and 504 comprise a current mirror, and transistors 506 and 508 comprise another current mirror. For the exemplary embodiment of FIG. 5, transistors 502, 504, 506, and 508 are sized so as to have equal betas, transistors 510 and 512 are sized to have equal betas, and transistors 518, 520, 522, and 524 are sized to have equal betas. Transistor 510 sources current and transistor 512 sinks current. The gates of transistors 510 and 512 are connected to each other and to the gates of transistors 502, 504, 506, and 508 to establish a self-biased operation point. Transistors 518 and 520 comprise a CMOS inverter and have the same beta, and transistors 522 and 524 comprise another CMOS inverter having the same beta as transistors 518 and 520.

Consider the operation of sense amplifier 500 for $V_{ref} = V_{cc}/2$. If $V_{in}$ increases above $V_{ref}$, then the voltage at node 516 must decrease in order for the current sourced by pMOSFET 518 to match the current sunk by nMOSFET 520. Similarly, if $V_{in}$ decreases below $V_{ref}$, then the voltage at node 516 must increase. Because of the current-to-voltage relationships of transistors 518 and 520, sense amplifier 500 has large gain for operating voltages near $V_{cc}/2$.

For operating voltages less than $V_{cc}/2$ (i.e., $V_{ref} < V_{cc}/2$), pMOSFETs 518 and 522 source more current than sunk by nMOSFETs 520 and 524, respectively. In this case, nMOSFET 508 serves as an active load to pMOSFET 518, and has a high dynamic impedance because of its connection to nMOSFET 506 to form a current mirror pair. Thus, CMOS sense amplifier 500 will still have high gain for small transitions of $V_{in}$ about $V_{ref}$. Similarly, for operating voltages greater than $V_{cc}/2$, nMOSFETs 520 and 524 will sink more current than sourced by pMOSFETs 518 and 522, respectively. In this case, pMOSFET 502 serves as an active load to nMOSFET 520, and has a high dynamic impedance because of its connection to pMOSFET 504 to form a current mirror pair. Thus again, CMOS sense amplifier 500 will have a high gain for small transitions of $V_{in}$ about $V_{ref}$.

Figure 6:
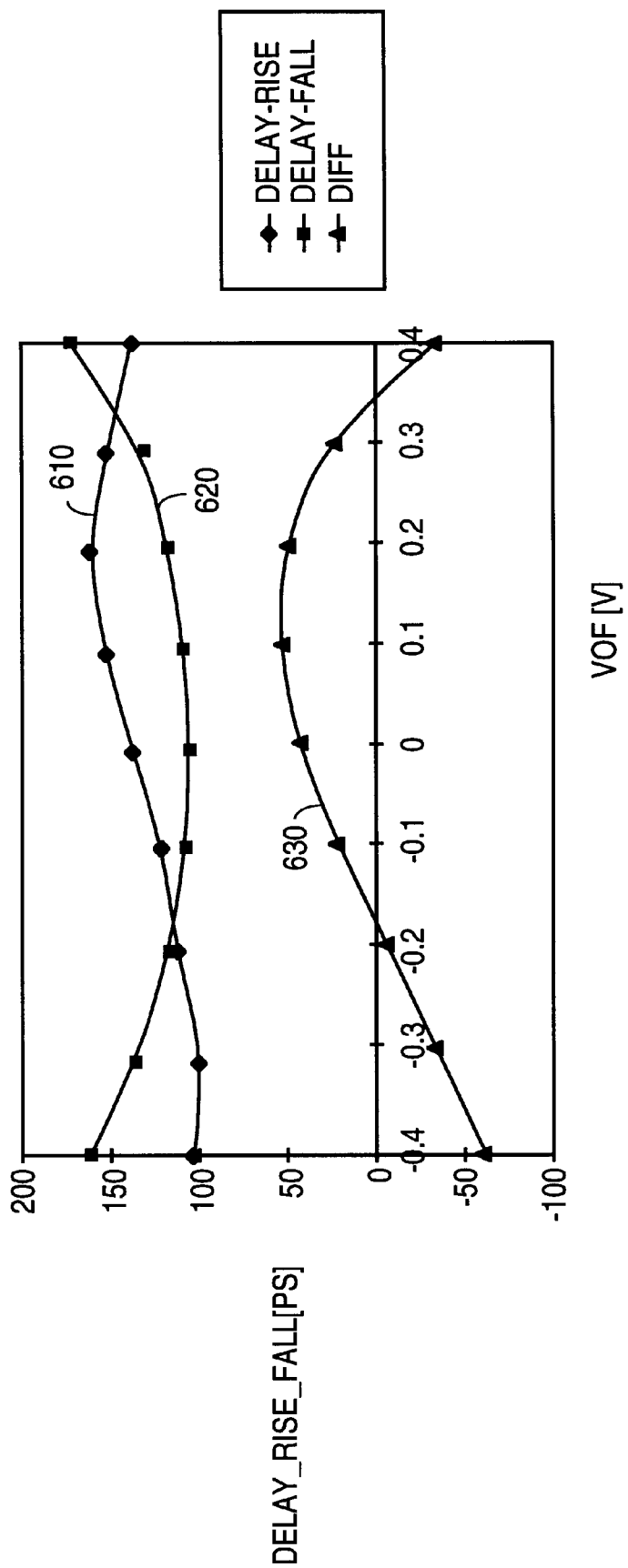
FIG. 6 is a plot of rising and falling edge delays for an exemplary embodiment of the present invention sense amplifier.

FIG. 6 shows output delay for the embodiment of FIG. 5 for various voltage levels, obtained by simulation. The x-axis of FIG. 6 indicates common mode voltage offset, where the voltage offset is zero for $V_{ref} = (2/3) V_{cc}$. The y-axis denotes pico-seconds. The input voltage $V_{in}$ is symmetric about the reference voltage and has a peak-to-peak voltage swing of 500 mV. A common mode voltage offset of x indicates that the voltage x is added to both of the waveforms for $V_{ref}$ and $V_{in}$. The input voltage $V_{in}$ has an edge rate of 4V/ns (volts/nano-second). For FIG. 6, the output of the sense amplifier is loaded by a CMOS inverter with the channel width-to-length ratio of the inverter's pMOSFET twice that of the inverter's nMOSFET. For the simulations performed, $V_{cc} \approx 1.06$ Volts.

Figure 7:
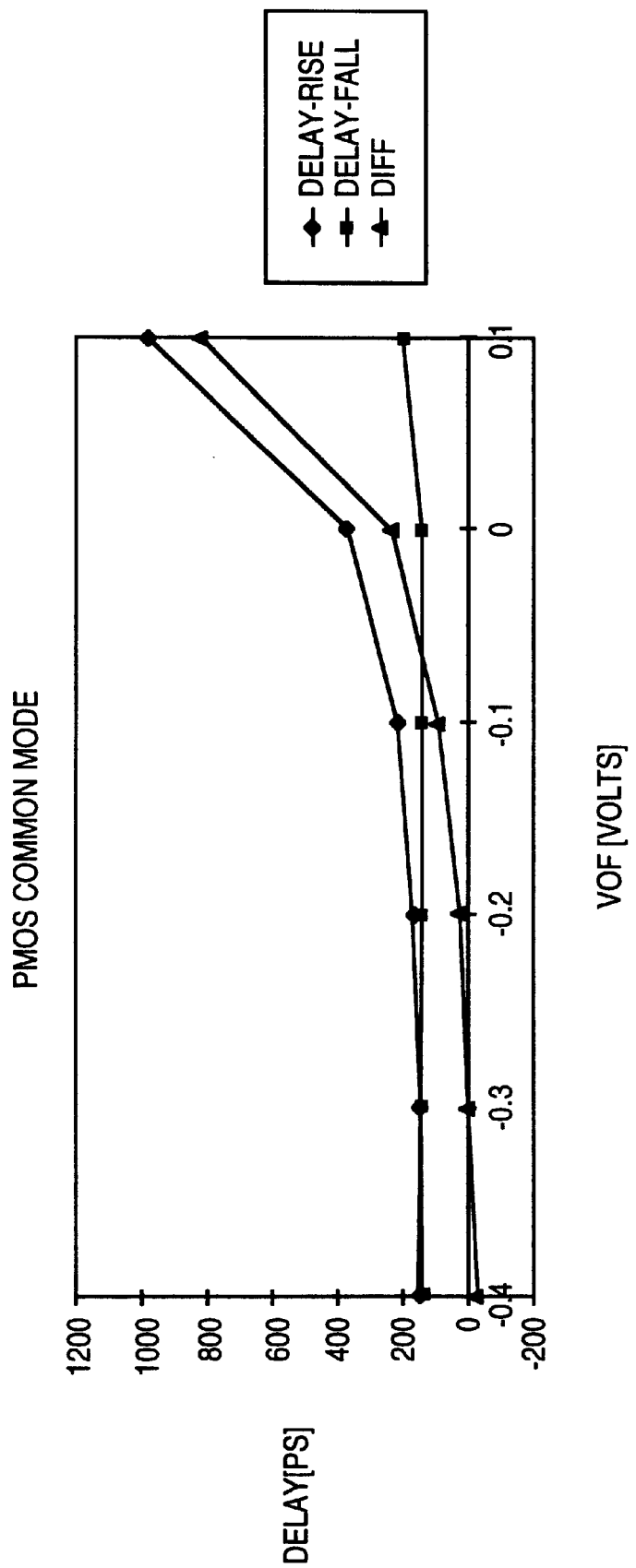
FIG. 7 is a plot of rising and falling edge delays for a prior art pMOS sense amplifier.
Figure 8:
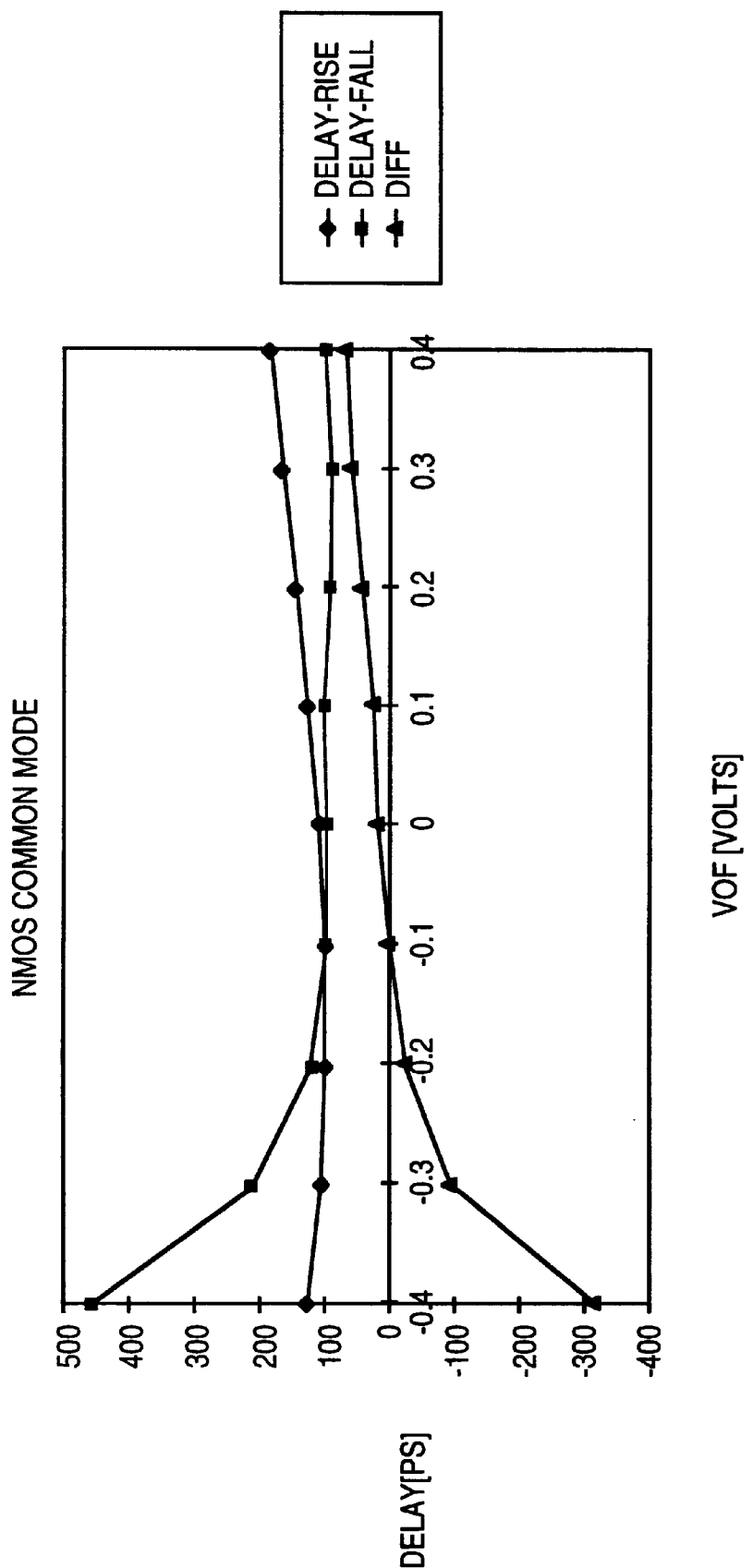
FIG. 8 is a plot of rising and falling edge delays for a prior art nMOS sense amplifier.
Figure 9:
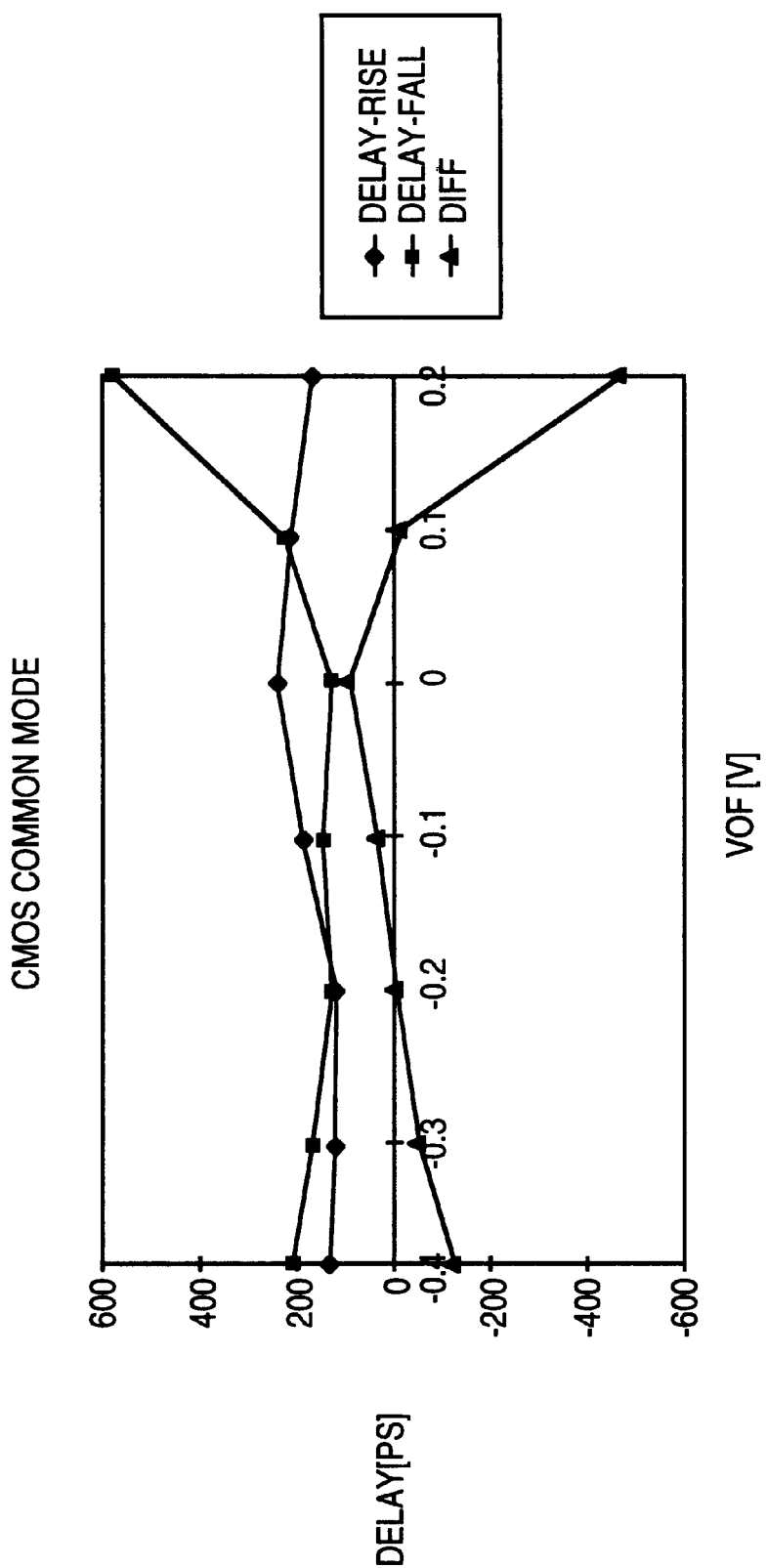
FIG. 9 is a plot of rising and falling edge delays for a prior art CMOS sense amplifier.

In FIG. 6, curve 610 indicates the delay in the rising edge of the sense amplifier output. Curve 620 indicates the delay in the falling edge of the sense amplifier output, whereas curve 630 is the difference between the rising edge and falling edge delays. FIGS. 7, 8, and 9 provides rising and falling edge delays for the prior art pMOS, nMOS, and CMOS sense amplifiers, respectively. As can be seen from FIGS. 6–9, the rising and falling edge delays for the embodiment of FIG. 5 does not vary appreciably for a relatively large range of voltage offsets when compared to the prior art sense amplifiers.

Various alternative embodiments to the embodiment of FIG. 5 may be realized. In an alternative embodiment, the gates of transistors 510 and 512 need not be biased at the same potential. For another embodiment, the current mirror comprising transistors 506 and 508 could be eliminated, but the resulting embodiment would not be robust for operating voltages appreciably below $V_{cc}/2$. A similar observation applies to the current mirror comprising transistors 502 and 504. In other embodiments, an external bias circuit may be employed rather than using the self-biasing connections of FIG. 5.

Many modifications may be made to the above described embodiments without departing from the scope of the invention as claimed below. For example, additional devices may be inserted between various nodes, terminals, and devices in the above embodiments without materially changing their overall function. For example, voltage drops may be introduced by diodes, or transistors configured as diodes, to change various voltage levels, or buffers may be inserted between various nodes, terminals, and devices.

For this reason, we give a precise definition to connection. We say that for any objects A and B in which a voltage is well defined, an object A is connected to an object B if they are connected together by a transmission line, or equivalently, a waveguide. A transmission line or waveguide is any structure for guiding electromagnetic waves. Part or all of the transmission line or waveguide may be non-metallic, such as polysilicon.

If objects A and B are coupled to each other, then they may be connected to each other as discussed above, or other means may be employed for relating the voltages of objects A and B, such as diodes, buffers, or other active or passive circuits. For these letters patent, we shall define a relationship between voltages as follows. We shall say that the voltage of an object A is related to the voltage of an object B by a strictly increasing function if the following holds: There exists a non-zero voltage interval (a,b) and a function $f$ strictly increasing on (a,b) for which $V_A(t_2)=f(V_B(t_1))$, where $V_A(t_2)$ is the voltage of object A at time $t_2$ and $V_B(t_1)$ is the voltage of object B at time $t_1$, where $t_2>t_1$ and $V_B(t_1)\in(a,b)$. The time difference $t_2-t_1$ may be a function of $V_B(t_1)$. In practice, $f$ is actually a function of more than one variable, but we assume that these other variables are held constant in the above definition.

What is claimed is:

1. An amplifier comprising:
    an input CMOS inverter comprising an input pMOSFET and an input nMOSFET, wherein the gates of the input pMOSFET and the input nMOSFET are at an input voltage;
    a first pMOSFET coupled to the input CMOS inverter to provide an active load to the input nMOSFET;
    a second pMOSFET coupled to the first pMOSFET to form a pMOS current mirror;
    a reference CMOS inverter comprising a reference pMOSFET and a reference nMOSFET, wherein the gates of the reference pMOSFET and the reference nMOSFET are at a reference voltage, wherein the second pMOSFET is coupled to the input CMOS inverter to provide an active load to the reference nMOSFET;
    a first pMOSFET coupled to the input CMOS inverter to provide an active load to the input nMOSFET;
    a second pMOSFET coupled to the first pMOSFET to form a pMOS current mirror and coupled to the reference CMOS inverter to provide an active load to the reference nMOSFET;
    a source pMOSFET having a source connected to the sources of the first and second pMOSFETs, having a drain connected to the sources of the input and reference pMOSFETs, and having a gate connected to the gates of the first and second pMOSFETs; and
    a sink nMOSFET having a source connected to the sources of the first and second nMOSFETs, having a drain connected to the sources of the input and reference nMOSFETs, and having a gate connected to the gates of the first and second nMOSFETs.

2. An amplifier comprising:
    an input CMOS inverter comprising an input pMOSFET and an input nMOSFET;
    a pMOS current mirror comprising first and second pMOSFETs, wherein the gates of the first and second pMOSFETs are connected to each other, the sources of the first and second pMOSFETs are connected to each other, and the gate of the second pMOSFET is connected to the drain of the second pMOSFET, wherein the drain of the first pMOSFET is connected to the drains of the input nMOSFET and the input pMOSFET;
    a nMOS current mirror comprising first and second nMOSFETs, wherein the gates of the first and second nMOSFETs are connected to each other, the sources of the first and second nMOSFETs are connected to each other, and the gate of the second nMOSFET is connected to the drain of the second nMOSFET, wherein the drain of the first nMOSFET is connected to the drains of the input nMOSFET and the input pMOSFET;
    a reference CMOS inverter comprising a reference pMOSFET and a reference nMOSFET, wherein the drains of the reference pMOSFET and the reference nMOSFET are connected to the drains of the second pMOSFET and the second nMOSFET;
    a source pMOSFET having a gate connected to the gates of the first and second pMOSFETs, and having a drain connected to the sources of the input pMOSFET and the reference pMOSFET; and
    a sink nMOSFET having a gate connected to the gates of the first and second nMOSFETs and having a drain connnected to the sources of the input nMOSFET and the reference nMOSFET.

3. The amplifier as set forth in claim 2, further comprising:
    a first pMOSFET coupled to the input CMOS inverter to provide an active load to the input nMOSFET.

4. The amplifier as set forth in claim 3, further comprising:
    a second pMOSFET coupled to the first pMOSFET to form a pMOS current mirror and coupled to the reference CMOS inverter to provide an active load to the reference nMOSFET.

5. An amplifier comprising:
    an input CMOS inverter comprising an input pMOSFET and an input nMOSFET, wherein the gates of the input pMOSFET and the input nMOSFET are at an input voltage and the drains of the input pMOSFET and the input nMOSFET are at an output voltage;
    a pMOS current mirror comprising a first pMOSFET and a second pMOSFET, wherein the output voltage is related to the voltage of the drain of the first pMSOFET by a strictly increasing function;
    a reference CMOS inverter comprising a reference pMOSFET and a reference nMOSFET, wherein the gates of the reference pMOSFET and the reference nMOSFET are at a reference voltage, wherein the drains of the reference pMOSFET and the reference nMOSFET are at a node voltage, wherein the node voltage is related to the voltage of the drain of the second pMOSFET by a strictly increasing function;
    a nMOS current mirror comprising a first nMOSFET and a second nMOSFET, wherein the voltage of the drain of the first nMOSFET is related to the voltage of the drain of the first pMOSFET by a strictly increasing function, wherein the voltage of the drain of the second nMOSFET is related to the voltage of the drain of the second pMOSFET by a strictly increasing function;
    a source pMOSFET, wherein the voltage of the gate of the second pMOSFET is related to the voltage of the gate of the source pMOSFEt by a strictly increasing function, the voltage of the source of the reference pMOSFEt is related to the voltage of the drain of the source pMOSFET by a strictly increasing function, and the voltage of the source of the input pMOSFET is related to the voltage of the drain of the source pMOSFET by a strictly increasing function; and
    a sink nMOSFET, wherein the voltage of the gate of the sink nMOSFET is related to the voltage of the gate of the second nMOSFET by a strictly increasing function, the voltage of the drain of the sink nMOSFET is related to the voltage of the source of the reference nMOSFET by a strictly increasing function, and the voltage of the drain of the sink nMOSFET is related to the voltage of the source of the input nMOSFET by a strictly increasing function.

6. An amplifier comprising:

an input CMOS inverter comprising an input pMOSFET and an input nMOSFET; and a pMOS current mirror comprising first and second pMOSFETs, wherein the gates of the first and second pMOSFETs are connected to each other, the sources of the first and second pMOSFETs are connected to each other, and the gate of the second pMOSFET is connected to the drain of the second pMOSFET, wherein the drain of the first pMOSFET is connected to the drains of the input nMOSFET and the input pMOSFET.

7. The amplifier as set forth in claim 6, further comprising:

a nMOS current mirror comprising first and second nMOSFETs, wherein the gates of the first and second nMOSFETs are connected to each other, the sources of the first and second nMOSFETs are connected to each other, and the gate of the second nMOSFET is connected to the drain of the second nMOSFET, wherein the drain of the first nMOSFET is connected to the drains of the input nMOSFET and the input pMOSFET.

8. The amplifier as set forth in claim 7, further comprising:

a reference CMOS inverter comprising a reference pMOSFET and a reference nMOSFET, wherein the drains of the reference pMOSFET and the reference nMOSFET are connected to the drains of the second pMOSFET and the second nMOSFET.

9. The amplifier as set forth in claim 8, further comprising:

a source pMOSFET having a gate connected to the gates of the first and second pMOSFETs, and having a drain connected to the sources of the input pMOSFET and the reference pMOSFET; and a sink nMOSFET having a gate connected to the gates of the first and second nMOSFETs, and having a drain connected to the sources of the input nMOSFET and the reference nMOSFET.

10. The amplifier as set forth in claim 8, wherein the gates of the input nMOSFET and the input pMOSFET are at an input voltage, wherein the gates of the reference nMOSFET and the reference pMOSFET are at a reference voltage, wherein the amplifier is to provide voltage gain at the drains of the input pMOSFET and the input nMOSFET with respect to small variations of the input voltage about the reference voltage.

11. The amplifier as set forth in claim 9, wherein the sources of the first and second pMOSFETs are connected to the source of the source pMOSFET, and wherein the sources of the first and second nMOSFETs are connected to the source of the sink nMOSFET.

12. The amplifier as set forth in claim 11, wherein the gates of the input nMOSFET and the input pMOSFET are at an input voltage, wherein the gates of the reference nMOSFET and the reference pMOSFET are at a reference voltage, wherein the amplifier is to provide voltage gain at the drains of the input pMOSFET and the input nMOSFET with respect to small variations of the input voltage about the reference voltage.

13. An amplifier comprising:

an input CMOS inverter comprising an input pMOSFET and an input nMOSFET, wherein the gates of the input pMOSFET and the input nMOSFET are at an input voltage and the drains of the input pMOSFET and the input nMOSFET are at an output voltage;

a pMOS current mirror comprising a first pMOSFET and a second pMOSFET, wherein the output voltage is related to the voltage of the drain of the first pMOSFET by a strictly increasing function;

a reference CMOS inverter comprising a reference pMOSFET and a reference nMOSFET, wherein the gates of the reference pMOSFET and the reference nMOSFET are at a reference voltage, wherein the drains of the reference pMOSFET and the reference nMOSFET are at a node voltage, wherein the node voltage is related to the voltage of the drain of the second pMOSFET by a strictly increasing function; and a nMOS current mirror comprising a first nMOSFET and a second nMOSFET, wherein the voltage of the drain of the first nMOSFET is related to the voltage of the drain of the first pMOSFET by a strictly increasing function, wherein the voltage of the drain of the second nMOSFET is related to the voltage of the drain of the second pMOSFET by a strictly increasing function.

14. The amplifier as set forth in claim 13, further comprising:

a source pMOSFET, wherein the voltage of the gate of the second pMOSFET is related to the voltage of the gate of the source pMOSFET by a strictly increasing function, the voltage of the source of the reference pMOSFET is related to the voltage of the drain of the source pMOSFET by a strictly increasing function, and the voltage of the source of the input pMOSFET is related to the voltage of the drain of the source pMOSFET by a strictly increasing function; and a sink nMOSFET, wherein the voltage of the gate of the sink nMOSFET is related to the voltage of the gate of the second nMOSFET by a strictly increasing function, the voltage of the drain of the sink nMOSFET is related to the voltage of the source of the reference nMOSFET by a strictly increasing function, and the voltage of the drain of the sink nMOSFET is related to the voltage of the source of the input nMOSFET by a strictly increasing function.

15. The amplifier as set forth in claim 14, wherein the voltage of the source of the second pMOSFET is related to the voltage of the source of the source pMOSFET by a strictly increasing function, and the voltage of the source of the sink nMOSFET is related to the voltage of the source of the second nMOSFET by a strictly increasing function.

* * * * *